(12) United States Patent
Balaram et al.

(10) Patent No.: US 6,560,572 B1
(45) Date of Patent: May 6, 2003

(54) MULTI-SIMULATOR CO-SIMULATION (75) Inventors: Anil P. Balaram, Toronto (CA); Rich Helms, Sunderland (CA)

(73) Assignee: Interactive Image Technologies, Ltd. (CA)

( * ) Notice: Subject to any disclaimer, the term of this patent is extended or adjusted under 35 U.S.C. 154(b) by 0 days.

(21) Appl. No.: 09/292,012

(22) Filed: Apr. 15, 1999

(51) Int. Cl.[7] ................................................ G06F 9/45
(52) U.S. Cl. .............................. 703/22; 703/16; 703/17
(58) Field of Search ............................ 703/3–5, 13–22; 716/1–11

(56) References Cited

U.S. PATENT DOCUMENTS

| | | | |
|---|---|---|---|
| 4,792,913 A | 12/1988 | Buckland et al. ............ 364/602 |
| 4,985,860 A | 1/1991 | Vlach .......................... 364/578 |
| 5,105,373 A | 4/1992 | Rumsey et al. .............. 364/578 |
| 5,715,184 A | * 2/1998 | Tyler et al. ................... 703/13 |
| 5,838,947 A | * 11/1998 | Sarin ............................. 703/14 |
| 5,889,685 A | * 3/1999 | Ramachandran ............. 703/16 |
| 6,202,044 B1 | * 3/2001 | Tzori ............................ 703/14 |

OTHER PUBLICATIONS

Miller, "EDA Watch: Verilog–A/AMS Extends Design Beyond the Digital Realm", Electronic Design, pp. 67–70 (Nov. 2, 1998).*

Hirsch et al, "Parallel Simulation of VHDL–AMS Models", Proceedings of the IEEE 1998 National Aerospace and Electronics Conference, pp. 545–551 (Jul. 1998).*

Cox III, "Code–Level Modeling in XSPICE", 1992 IEEE International Symposium on Circuits and Systems, vol. 2, pp. 871–874 (May 1992).*

* cited by examiner

*Primary Examiner*—Samuel Broda
(74) *Attorney, Agent, or Firm*—Katten Muchin Zavis Rosenman (57) ABSTRACT

A mixed-mode simulator for simulating a circuit containing an event-driven device with a plurality of pins. The mixed-mode simulator has a circuit simulator for simulating at least an analog portion of the circuit. The circuit simulator has a user-defined device modeling feature. The mixed-mode simulator has an event-driven device simulator and an interface between the circuit simulator and the event-driven device simulator. The interface has a parameter passing portion for receiving values from and returning values to the circuit simulator through the user-defined device modeling feature. The interface has a timing portion for instructing the event-driven simulator to run a simulation of the device based on the values for a given time period. The interface has a response reading portion for reading values of the pins at the end of the time period. Values are returned to the circuit simulator through the parameter passing portion and the user-defined modeling feature.

8 Claims, 6 Drawing Sheets

√ Accepted timestep (set checkpoint)

x Rejected timestep (use previous checkpoint)

MULTI-SIMULATOR CO-SIMULATION

FIELD OF THE INVENTION

Two types of electronic simulation are circuit simulation and device simulation. A circuit simulator simulates the working of a circuit made up of devices. A device simulator simulates the workings of a device by emulating the elements of the device. A device simulator is used to design a new device while a circuit simulator is used to design a complete circuit.

Due to the nature of circuits and devices, different approaches to simulation have been designed.

A popular analog circuit simulator, created at the University of California at Berkeley, is SPICE. SPICE is a general-purpose circuit simulator with several built-in semiconductor device models. SPICE does analog simulation based on matrix solution techniques. The University of Georgia Tech extended this work by adding event-driven simulation and called the result XSPICE. XSPICE includes both analog and event-driven simulation. XSPICE is capable of simulating analog devices and a specific list of digital devices and devices modeled in programs referred to as a "code models".

Most complex digital devices are separately designed using an event-driven simulator, such as an HDL (Hardware Description Language). Examples include VHDL or Verilog. (Verilog-XL is a registered trademarks of Cadence Design Systems, Inc.)

It is desirable to simulate a digital device, written for an event-driven simulator, in a mixed-mode (analog/digital) circuit. It is also desirable to permit debugging of both the circuit and the digital device at the same time (i.e. debugging the internals of a device designed in an HDL, while debugging the circuit that uses the HDL defined device).

Such mixed-mode simulation is useful, for example, when designing the circuits in cellular telephones. The circuit portions which receive and transmit sound and radio frequencies are analog. Conventionally, they are simulated using SPICE. Linking these analog portions, typically, is a digital chip (or chips) to control, encrypt, decrypt, encode and decode. Digital chips are often described in a high level design language ("HDL") and simulated separately. It is desirable to simulate the entire system, both analog and digital portions, together.

One technique is to "connect" simulators (i.e. use XSPICE to do the analog and basic digital devices and another simulator to do VHDL with yet another for Verilog). As other device simulation technologies are added, other simulators are connected.

A key technical problem is the incompatibility of the basic principals of each simulator. One example of this incompatibility is time.

1. Digital device event-driven simulators only move forward in time as the outcome for the next step is always predictable. Continuous function circuit simulators, such as SPICE, on the other hand "try" a future value and if that doesn't work, back up in time and try another value.
2. Digital device simulators tend to work in larger, more uniform units of time than analog circuit simulators.

The requirement to simulate and debug a circuit and a chip at the same time requires that the simulators stay in sync and the user interfaces are driven by this synchronized time.

One solution is that of Viewlogic Systems in a product called "Fusion"™. This approach to coordinating time and communications across simulators is to build a supervisor. All simulators are controlled by the FUSION control program. It sets all timings and coordinates all data. This approach forces all of the simulators to be modified to work in this environment as all simulators must derive their timing information from the supervisor.

An alternate solution is desirable.

SUMMARY OF THE INVENTION

In a first aspect, the invention provides a mixed-mode simulator for simulating a circuit containing an event-driven device with a plurality of pins. The mixed-mode simulator has a circuit simulator for simulating at least an analog portion of the circuit. The circuit simulator has a user-defined device modeling feature. The mixed-mode simulator has an event-driven device simulator and an interface between the circuit simulator and the event-driven device simulator. The interface has a parameter passing portion for receiving values from and returning values to the circuit simulator through the user-defined device modeling feature. The interface also has a timing portion for instructing the event-driven simulator to run a simulation of the device based on the values for a given period of time. The interface further has a response reading portion for reading the values of the pins at the end of the period of time. The values are returned to the circuit simulator through the parameter passing portion and the user-defined modeling feature.

The circuit simulator may be a SPICE-type simulator. It may also be a XSPICE-type simulator. The event-driven device simulator may be an HDL simulator.

Upon first call of the interface by the circuit simulator for any one circuit to be simulated, the interface may acquire the definition of the pins of the device from the event-driven simulator.

The mixed-mode simulator may have a plurality of event-driven device simulators, and a corresponding interface for each event-driven device simulator.

In a second aspect the invention provides, a mixed-mode simulator has circuit simulator software for simulating at least an analog portion of the circuit. The circuit simulator software has a user-defined device modeling feature. The mixed-mode simulator also has event-driven device simulator software, and interface software. The circuit simulator software, the event-driven device simulator software, and the interface software run on computer processing means, including storage media and operating system software. The interface software has a parameter passing portion for receiving values from and returning values to the circuit simulator software through the user-defined device modeling feature. The interface software has a timing portion for instructing the event-driven simulator software to run a simulation of the device based on the values for a given period of time. The interface software further has a response reading portion for reading the values of the pins at the end of the period of time. The values are returned to the circuit simulator software through the parameter passing portion and the user-defined modeling feature.

In a third aspect the invention provides the interface of the first aspect, while on a fourth aspect, the invention provides the interface software and accompanying storage media of the second aspect.

DETAILED DESCRIPTION OF THE PREFERRED EMBODIMENT

Figure 1:
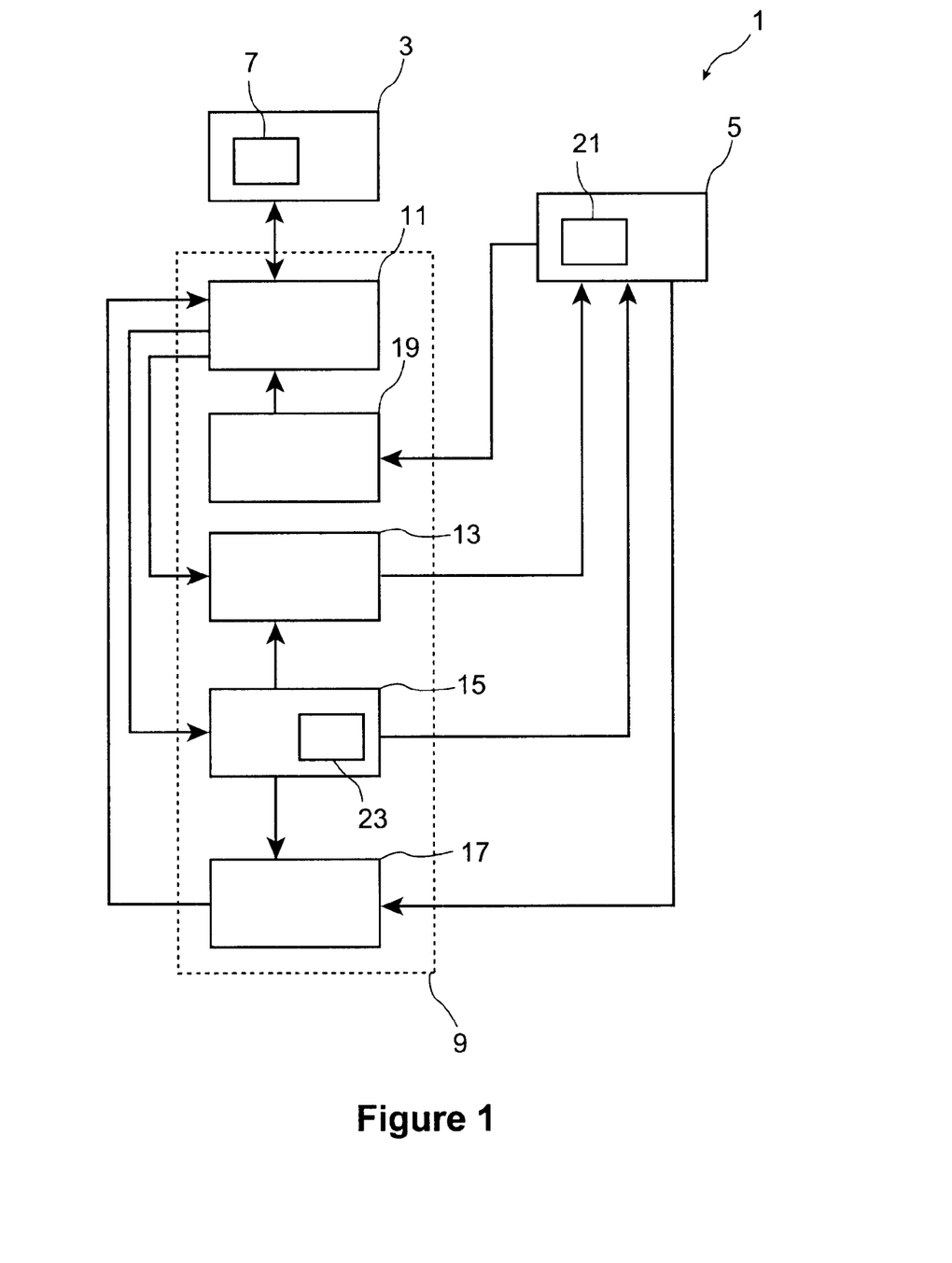
FIG. 1 is a block diagram of a mixed-mode simulator according to the preferred embodiment of the invention.

Referring to FIG. 1, a mixed-mode simulator 1 has a circuit simulator 3 and an event-driven device simulator 5. The circuit simulator 3 has a user-defined modeling feature 7 which allows a user of the simulator 3 to link a model of a device, for example a resistor, capacitor, transistor or higher-level device, such as a limiter or multiplier, to the simulator 3. An example of a simulator 3 is the XSPICE simulator referred to earlier.

3. An example of a simulator 3 is the XSPICE simulator referred to earlier.

The simulator 3 and simulator 5 are linked through an interface 9. The interface 9 has a parameter passing portion 11, a stimulus setting portion 13, timing portion 15, response receiving portion 17, and definition acquisition portion 19.

The parameter passing portion 11 receives parameters from the circuit simulator 3 and return parameters to the simulator 3, through the user-defined modeling feature 7. The stimulus setting portion 13 sets signal inputs of the event-driven simulator 5 to values contained in parameters received by the parameter passing portion 11 from the circuit simulator 3.

The timing portion 15 instructs the event-driven simulator 5 to run (simulate) for an amount of time contained in the parameters received by the parameter passing portion 11 from the circuit simulator 3. Once the simulator 5 has run for the amount of time, the response receiving portion 17 obtains signal output values from the event-driven simulator 5 and passes them as parameters through the parameter passing portion 11 to the circuit simulator 3. The circuit simulator 3 utilizes the parameters it receives from the parameter passing portion to continue its circuit simulation.

The simulator 5 also contains a debug feature 21, and the signal inputs to the event-driven simulator 5 from the stimulus setting position 13 can be used by the debug feature separately to debug the device within the event-driven simulator 5 using debug techniques that will be evident to those skilled in the art.

The timing position 15 further contains a synchronization element 23. The synchronization element 23 saves the various input values and output values of the event-driven simulator 5 at the last point in time of circuit simulator successful convergence. The synchronization element 23 is able, on request, to revert to the saved input values, output values and time (a "state").

Circuit simulators 3 typically operate by attempting to move forward a given increment in time to see if signal convergence is obtained. If convergence is not obtained then the simulator 3 backs up in time and moves forward in a smaller time increment. This process is repeated until convergence occurs.

Event-driven simulators 5 typically only move forward in time. The synchronization element 23 is used to back up the event-driven simulator 5 in the event that the circuit simulator 3 is backed up in time to the last successful convergency. If there is no currently saved state in the synchronization element 23, and the timing position 15 is instructing the event-driven simulator 5 to run, then the current state is the saved.

The interface 9 also contains a definition acquisition portion 19 that obtains a list of pins defined in the event-driven simulator 5, along with the type of pins used in the device in the event-driven simulator 5 for example a bit or a bit vector, and the type of pin actually assigned by the event-driven simulator 5 to each pin in the device. Definition acquisition need only occur once for each device. In the preferred embodiment, definition acquisition is performed using function calls which return the information.

Figure 2:
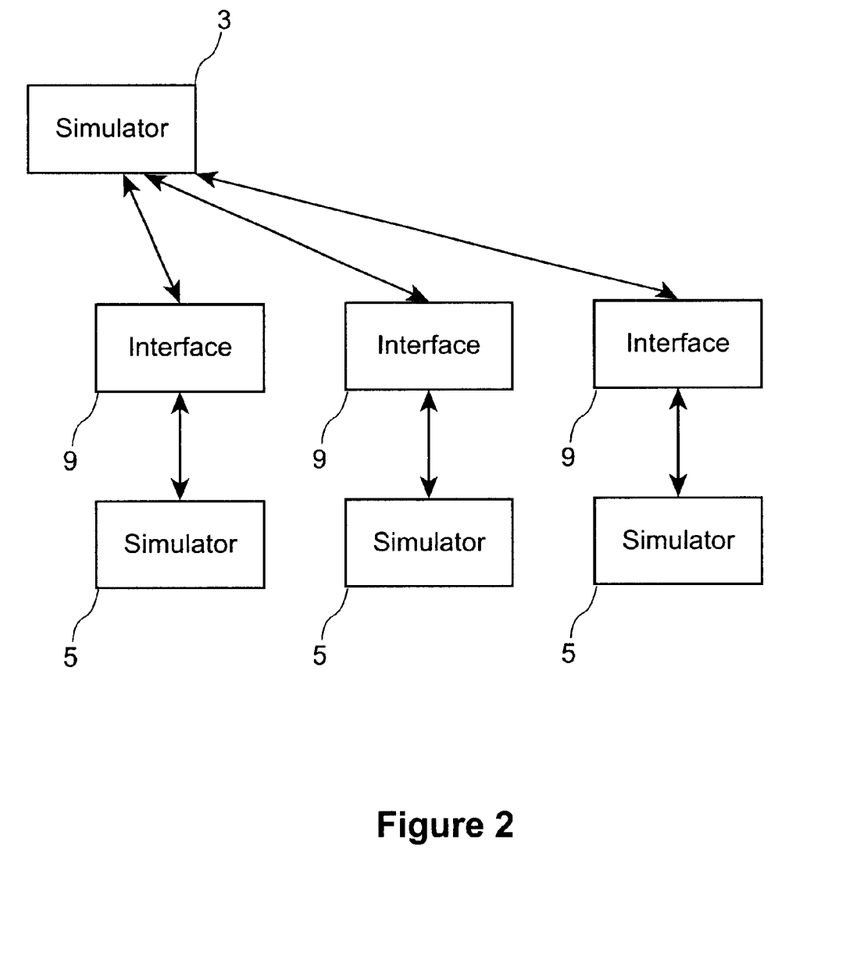
FIG. 2 is a block diagram of a mixed-mode simulator as set out in FIG. 1 incorporating multiple event-driven digital device simulators.

Referring to FIG. 2, the structure discussed above can be extended to use multiple event-driven simulators through separate interfaces. Parallelism may be invoked to increase processing power by utilizing multiple circuit simulators 3, each with its own section of the circuit being simulated. As will be evident to those skilled in the art of simulation, the simulators 3, 5 and the interface 9 will be implemented in computer programs running on one or more computers utilizing individual or multiple processors, as appropriate or desired for a particular application.

Referring to FIGS. 3 through 7, an example embodiment utilizing an XSPICE simulator 30 as a circuit simulator 3 and an HDL simulator 32 as an event-driven simulator 5 is set out below. In this case, the interface 7 is a C or C++ code model 34 which is linked with the XSPICE simulator 30, using known technologies.

Figure 3:
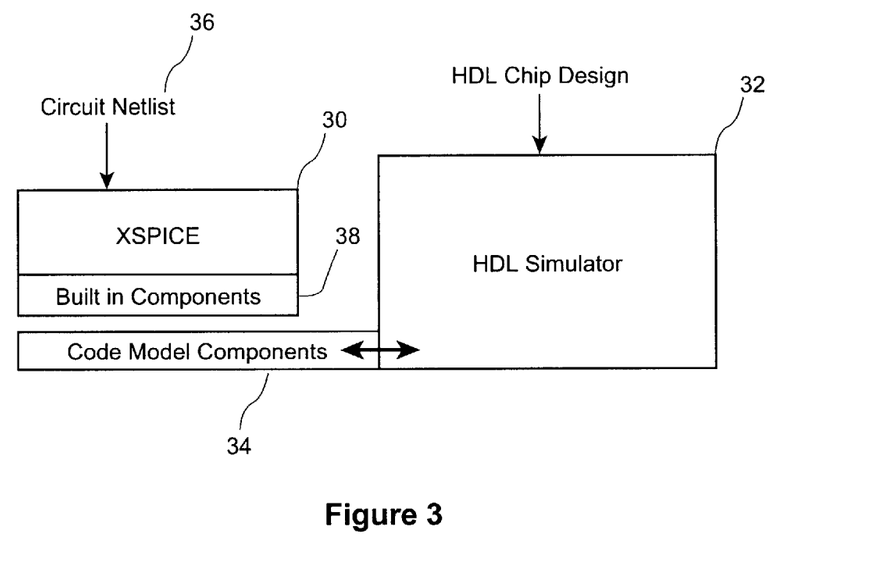
FIG. 3 is a block diagram of an XSPICE/HDL implementation of the mixed-mode simulator of FIG. 1.

A circuit simulator, which may have event-driven features, acts as a "supervisor" to secondary circuit simulators and/or event-driven device simulators. For example, XSPICE can be used to supervise HDL simulators 32 and/or SPICE simulators, not shown. SPICE based simulators act as devices in a circuit. The circuit simulator 3 is a supervisor in addition to its simulator function as it provides stimulus to and receives responses from, the event-driven simulator 5. The event-driven simulator 5 is secondary as it receives stimulus from, and provide responses to, the circuit simulator 3. To this end, a capability in XSPICE called code modeling was employed in the simulator 30.

Code modeling is the ability to add new device models to the simulator. In XSPICE generally, code models are written in a C or C++ program to calculate the desired results for how the device works. The code model program is fed stimulus by XSPICE and the response is calculated in the code model and returned to XSPICE. C/C++ programs can be added to SPICE with more coding work than XSPICE. XSPICE just made adding code for devices easier to do.

Consider the two simulators 30, 32 in isolation.

Circuit Simulator

A netlist 36 is a means to define a circuit. It is a list of devices and connections.

The netlist 36 describing the circuit is created by a user. The netlist 36 is fed to XSPICE simulator 30. The XSPICE simulator 30 uses built-in devices 38 of XSPICE as well as devices externally described with code modeling to simulate the circuit.

Event-Driven Device Simulator

A device is specified to the simulator 32 as a design program. The design program cannot run in isolation. It must be fed stimulus and list responses to be checked. Ordinarily, a test harness, not shown, is written to test the device by providing the stimulus and expected responses.

Writing test harnesses can be time consuming. One must ensure that there are no bugs in the test harness. Also, the coverage of the program functionality must be as complete as desired (i.e. for all the possible different stimuli, the desired response is produced).

Integrating Event-Driven and Circuit Simulators

In the example implementation, the code model 34 in XSPICE provides a test harness for the HDL simulator 32. The code model 34 talks to the HDL simulator 32 and provides the stimulus from the simulator 30 to the simulator 32 and returns the responses from the simulator 32 to the simulator 30. To the HDL simulator 32 this functions as a test harness.

Figure 4:
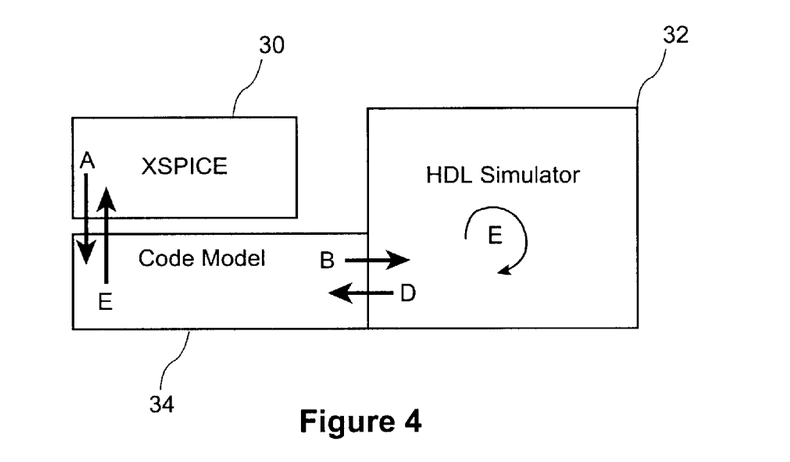
FIG. 4 is a block diagram of the implementation of FIG. 3 illustrating links within the mixed-mode simulator of FIG. 1.

Referring to FIG. 4, the steps to how the simulators are linked are:
A. The code model 34 is fed stimulus by the XSPICE simulator 30
B. This stimulus is fed via the code model 34 to the HDL simulator 32
C. The HDL simulator 32 calculates the appropriate response
D. The response is returned to the code model 34
E. The code model 34 returns the response back to the XSPICE simulator 30

This linking meets the requirements of each simulator 30, 32. The XSPICE simulator 30 sees the device in the HDL simulators 32 as just another model that is supplied stimulus and gets back responses. The HDL simulator 32 sees the stimulus from the XSPICE simulator 30 through the code model 34 as stimulus from a test harness and the response the HDL simulator 32 feeds back to the simulator 30 through the code model 34 is fed back as response from the digital device to a test harness.

Interfaces Between Simulators—Digital to Analog and Analog to Digital

Most HDL devices are digital but most HDL simulators 32 store many states of signals within the simulator 32 to indicate ramp conditions and level of the line. XSPICE simulators 30 also supports several digital levels of the line but with a different number of levels to HDL simulators 32. To directly map creates accuracy issues.

A solution is to turn the HDL simulator 32 states into their analog equivalent (D to A bridging). The digital device is then seen in the XSpice simulator 30 circuit as an analog device. Stimulus is fed to the code model 34 from the HDL simulator 32 as a digital signal. The code model 34 then translates this to an appropriate signal for input to the XSpice simulator 30. A corresponding analog to digital conversion occurs when stimuli are sent from the XSpice simulator 30 through the code model 34 to the HDL simulator 32. The D to A and A to D conversions are implemented in the code model 34 in a manner known to those skilled in the art.

Function Call

The following is a list of the function calls within the code model 34 to enable communication between the simulators 30, 32. This is documented below in the way the XSPICE code model 34 talks to the HDL simulator 32. The function calls from the XSPICE simulator 30 to the code model 34 will be similar to those from the code model 34 to the HDL simulator 32 adapted to the existing XSPICE code modelling protocol. Parameters are those items transmitted from the XSPICE code model 34 to the HDL simulator 32, while Return Values are those items transmitted in response by the HDL simulator 32 to the XSPICE code model 34.

Figure 6:
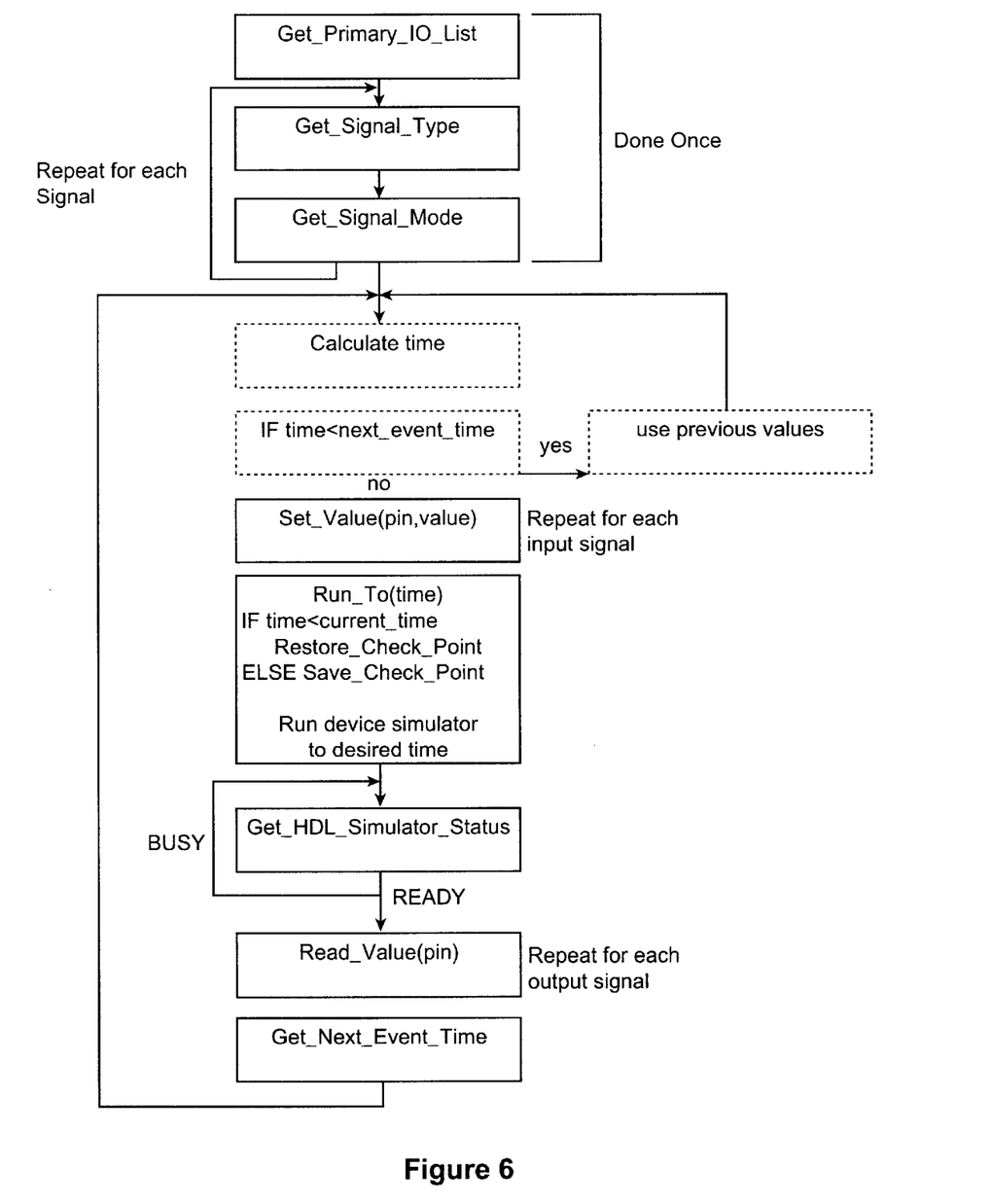
FIG. 6 is a flow chart illustrating the operation of an interface within the mixed-mode simulator of FIG. 1.

A flow chart for the interface 9 using the listed function calls is set out in FIG. 6. The dashed boxes represent steps within the circuit simulator 30, and not function calls.

Function calls are first used by the code model 34 to acquire the definition (i.e. pins and characteristics) of the HDL design of the device from the simulator 32.

Get_Primary_IO_List

This command returns the list of pins that are defined in the HDL simulator 32. As a device can have any collection of pins, it is necessary to query to find this. At this point, the XSPICE simulator 30 does not know that type of pins each are, just the list.

Parameter(s): (Administrative, none of interest).
Return value: Name of next primary input or output signal.

Get_Signal_Type

This command returns the signal types of pins that are defined in the HDL simulator 32. Some type examples are a bit or bit vector.

Parameter(s): Name of signal.
Return value: Type of signal.

Get_Signal_Mode

The simulator 32 is queried for each pin from the Get_Primary_IO_List result using Get_Signal_Mode to find out what type of pin it is. The naming is from the device's perspective. Possible results include:

Input
Output
Buffer
InOut—bi-directional

One call is made to get the list of pins and one per pin to get the type of that pin. This could be combined for performance reasons into a single function call.

Parameter(s): Name of signal.
Return value: Mode of signal.

Setting Stimulus and Reading Responses

Set_Value(Pin, Value)
Set the input or InOut pins to the passed value to send stimulus to the device within the simulator 32.

Parameter(s): Name of signal, new value for signal, time delay until new value.
Return value: (Administrative, not of interest).

Read$_{13}$ Value(pin)
Return the value of an output, InOut or buffer pin to read responses from the device within the simulator 32.

Parameter(s): Name of signal.
Return value: Current value of signal.

Keeping Timing in Sync

SPICE simulators, of which an XSPICE simulator 30, is a subset, can move forward and backward in time as they try and retry possible directions. In order to interface to an HDL simulator which only has a concept of moving forward in time, several calls are added to save an old successful state for later use in the event the simulation fails.

Figure 5:
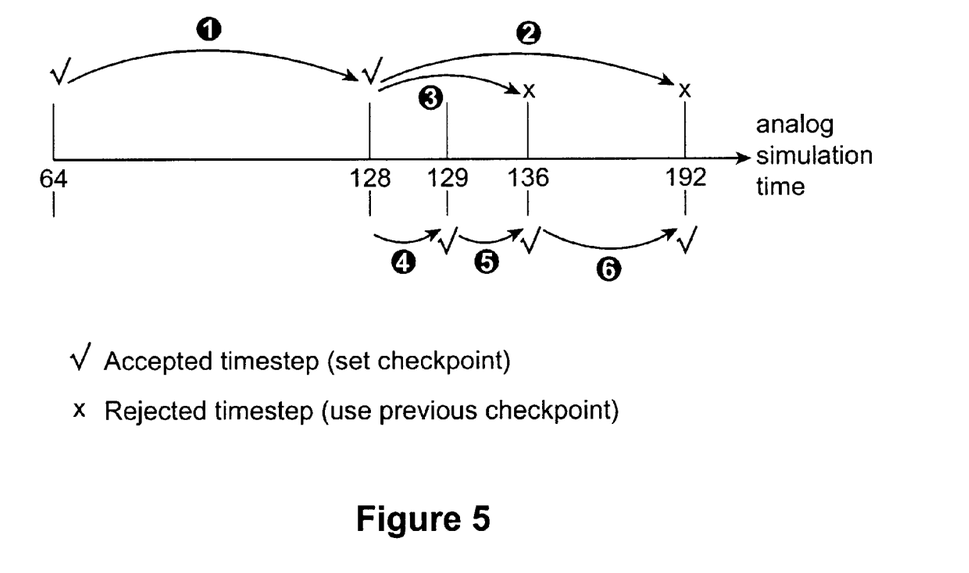
FIG. 5 is a timeline illustrating a possible scenario in simulating a circuit within a circuit simulator within the mixed-mode simulator of FIG. 1.

FIG. 5 and Table 1 illustrate a possible scenario in simulating a circuit within XSPICE simulator 30 using standard techniques.

TABLE 1

| Step | Current Time (API call) | Action | Analog Result |
|---|---|---|---|
| 1 | 128 | set "checkpointed state" to state at time 64 | success |
| 2 | 192 | set checkpointed state to state at time 128 | failure |
| 3 | 136 | Load simulator state from checkpointed state | failure |
| 4 | 129 | Load simulator state from checkpointed state | success |
| 5 | 136 | set checkpointed state to state at time 129 | success |
| 6 | 192 | set checkpointed state to state at time 136 | success |

In support of time movement are several interfaces. XSPICE appears to move several times backward but in actuality it only has a saved state and a current state. Saving one state is enough.

Save_Check_Point

This call tells the HDL simulator 32 to save the data at this point in time. The code can then revert to this state by calling Restore_Check_Point.

Parameter(s): (None).

Return value: (Administrative, not of interest).

Restore_Check_Point

This call restores the HDL simulator 32 to the state that was saved when Save_Check_Point was last called.

The Set Value and Read Value calls are used to set and read values from the device in simulator 32 for Save Check Point and Restore Check Point respectively.

Parameter(s): (None).

Return value: (Administrative, not of interest).

Run_To(time)

This call instructs the simulation in simulator 32 to run until a specified time.

If the time is less than the current time but greater than the last checkpoint time, the checkpointed simulator 32 state is restored with Restore_Check_Point and the simulator is instructed to run up to the specified time.

If the time is greater than the current time and no checkpoint has been set, the current simulator 32 state is saved with Save_Check_Point and then the simulator is instructed to run up to the specified time.

In HDL simulator 32 terminology, this method sets the simulator 32 state to be RUNNING and returns immediately. Once simulation has completed, the simulator 32 state becomes READY.

Example Calls for Timing

The time flow of FIG. 5 and Table 1 can be shown with the calls set out below in Table 2.

TABLE 2

| Step | Checkpointed time | Call | Analog Result | Implicitly called |
|---|---|---|---|---|
| 1 | 64 | Run_To(128) | success | Save_Check_Point |
| 2 | 128 | Run_To(192) | failure | Restore_Check_Point |
| 3 | 128 | Run_To(136) | failure | Restore_Check_Point |
| 4 | 128 | Run_To(129) | success | Save_Check_Point |
| 5 | 129 | Run_To(136) | success | Save_Check_Point |
| 6 | 136 | Run_To(192) | success | Save_Check_Point |

As the XSPICE simulator 30 instructs the HDL simulator 32 to move forward in time (Run_To), the HDL simulator 32 can provide to an HDL debugger 40 (see FIG. 7), as an example of debugger 21 (FIG. 1) data that is up to the checkpointed time. This way the HDL debugger 40 doesn't have to deal with handling going backward in time.

Parameter(s): Time up to which to simulate.

Return value: (Administrative, not of interest).

Get_HDL_Simulator_Status

This call returns the state of the HDL simulator 32. In order to permit parallel processing, the Run_To call does not wait for simulation to complete and returns immediately. Accordingly, it is necessary to query the HDL simulator 32 to determine if it is ready to respond.

When the Run_To function is called, it instructs the device simulator to START simulating to a specified time. Now both the circuit and device simulators simulate. The circuit simulator needs to know if the device simulator is done. It does this be quering the device simulator with Get_HDL_Simulator_Status. When this call returns READY, the circuit simulator knows it can request the results.

Return BUSY or READY to deliver data.

Parameter(s): (None).

Return value: Current state of HDL simulator.

Get_Next_Event_Time

Returns the time of the next top-level output or bi-directional signal event (a prediction of when any information will change in the HDL simulator 32) in the HDL simulator 32. If the XSPICE simulator 30 requires data before this time, the saved data is used as the values will change in the interim. This is used to eliminate some unnecessary calls to the HDL simulator 32.

The first time the device simulator is called, two key pieces of information are returned; the results and the time of the next event. This time is the next nearest time that the results COULD change. The circuit simulator 30 stores both the time of the next event and the results. If the circuit simulator 30 needs results before the time of the next event, the stored (saved) results are used.

Parameter(s): (None).

Return value: Time of next change in value (event) in HDL simulator.

Extensions to the Base Architecture

Figure 7:
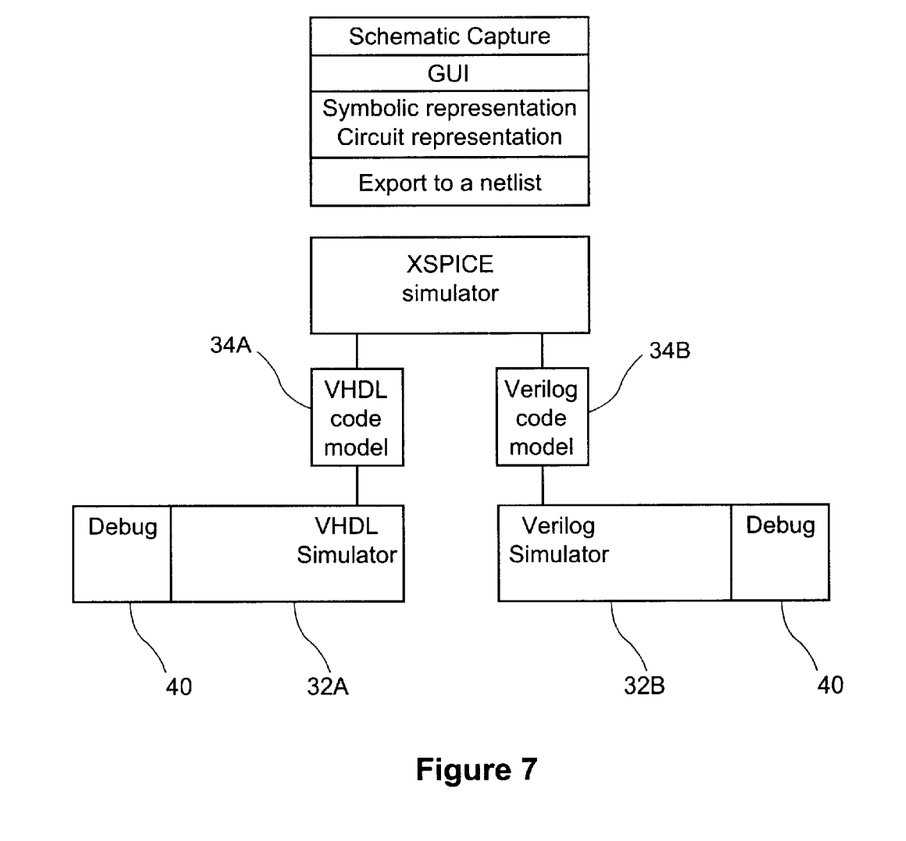
FIG. 7 is a block diagram of an implementation of a mixed-mode simulator with multiple event driven device simulators.

Referring to FIG. 7, the base concept of an HDL simulator 32 sitting under an XSPICE simulator 30 can be easily extended. Any number of code models 34 can be used in the XSPICE simulator 30, for example a code model 34A and a code model 34B, to a VHDL simulator 32A and a Verilog simulator 32B, respectively, with consequent modifications as will be evident to those skilled in the art to account for the variation between VHDL™ and Verilog™ as examples of HDL simulator 32 any number of HDL simulators 32 as well as other simulators such as a DSP simulator 42 can be used. Even copies of an XSPICE simulator 30C could be used to simulate boards in a complex arrangement of boards in a system.

Figure 8:
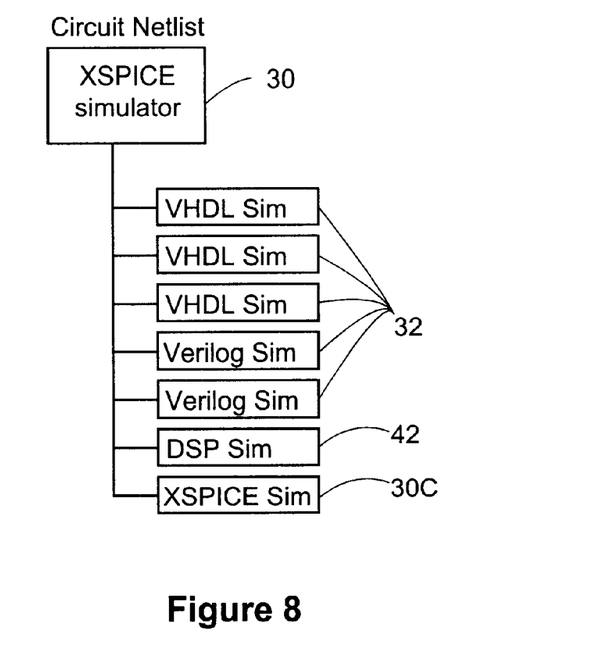
FIG. 8 is a block diagram of a further implementation of a mixed-mode simulator with multiple event driven device simulators.

Referring to FIG. 8, by having multiple copies of XSPICE, not shown, parallelism is also possible by separately simulating sections of a circuit. None of these copies is required to run on the same machine as long as the communications between the simulators 30, 32 provided. Multiple HDL simulators can be run to support multiple chip simulations. Some of the calls would be combined in a cross machine communications environment to reduce overhead and improve performance. In each case, the other simulator appears as a device to the SPICE simulator circuit.

This approaches discussed herein can provide numerous benefits.

In one or more embodiment of the described embodiments is provided:

1. a way to test a circuit with a complex device in it. In XSPICE alone, a circuit without a device can only be simulated as pieces with some artificial stimulus and response for the chip.
2. a test case for the chip by placing it in a target circuit in simulation. In HDL design alone, a significant percentage of the design time is spent preparing test cases to ensure adequate coverage of the functionality of the device. By placing the HDL device in the circuit a new test case is generated, the device in the final circuit.
3. a simple system to implement. An interface implemented in XSPICE only requires an appropriate code model be written. An HDL simulator typically has had the ability to talk to a test harness so it is only necessary to replace the harness with calls from the XSPICE code model implementation of the interface.
4. as neither program (XSPICE nor the HDL simulator) has been restructured, the debugging feature in both simulators 30, 32 is permitted with little change. The only significant change required to the HDL simulator 32 for the debug feature 40 to continue operating properly is to make the debug feature 40 wait for stimulus from the XSPICE code model.
   As the HDL simulator 32 assumes it goes forward in time only, the debug feature 40 would otherwise use data and results as they are generated. As time in this application can go backward, it is necessary for the debug feature 40 to only act on results when a time has been saved, for example using Save_Check_Point (i.e. there will be no further need to go back from this time). This limits the impact to the debug feature 40 once the debug feature 40 is insulated from the concept of backing up in time).
5. The HDL debugger doesn't have to be modified to deal with going back in time. The HDL debugger should just wait for Check_Pointed time to give to the GUI.
6. Parallel processing is permitted in the design. The HDL simulator runs as a different process to the XSPICE simulator. The connection between them could be a communications system permitting simulating across machines and distance. This provides parallel processing performance advantages. This has the added benefit that different user skills could be at each machine (i.e. a board level person at XSPICE and a chip designed at the HDL simulator).

The above example has been generally described with reference to an XSPICE simulator 30 as the circuit simulator 3. As an alternate example, a SPICE simulator, not shown, may be used as the circuit simulator 3, while an HDL simulator 32 is again used as the event-driven simulator 5. In this case, the interface 9 is a C or C++ computer program embedded in the SPICE simulator using known technologies. The computer program can otherwise embody the techniques, structure and flow described in respect of the code model 34.

Other embodiments and examples will be evident to those skilled in the art based on the principles of the invention, and falling within its spirit and scope as defined by the following claims.

We claim:

1. A mixed-mode simulator for simulating a circuit containing an event-driven device with a plurality of pins, the mixed-mode simulator comprising:
   a circuit simulator for simulating at least an analog portion of the circuit and containing a user-defined device modeling feature;
   an event-driven device simulator;
   an interface between the circuit simulator and the event-driven device simulator;
   wherein the interface comprises, a parameter passing portion for receiving values from and returning values to the circuit simulator through the user-defined device modeling feature, a timing portion for instructing the event-driven simulator to run a simulation of the device based on the values for a given period of time, a response reading portion for reading the values of the pins at the end of the period of time, the values to be returned to the circuit simulator through the parameter passing portion and the user-defined modeling feature; and
   wherein upon first call of the interface by the circuit simulator for any one circuit to be simulated, the interface acquires the definition of the pins of the device from the event-driven simulator for the circuit simulator.

2. The mixed-mode simulator of claim 1, wherein the circuit simulator is a SPICE-type simulator.

3. The mixed-mode simulator of claim 1, wherein the circuit simulator is an XSPICE-type simulator.

4. The mixed-mode simulator of claim 1, wherein the event-driven device simulator is an HDL simulator.

5. The mixed-mode simulator of claim 2, wherein the event-driven device simulator is an HDL simulator.

6. The mixed-mode simulator of claim 3, wherein the event-driven device simulator is an HDL simulator.

7. The mixed-mode simulator of claim 1, wherein said event-driven device simulator comprises a plurality of event-driven device simulators, and wherein there is a corresponding interface for each of said event-driven device simulators.

8. A mixed-mode simulator for simulating a circuit containing an event-driven device with a plurality of pins, the mixed-mode simulator comprising:
   circuit simulator software for simulating at least an analog portion of the circuit, the circuit simulator having a user-defined device modeling feature;
   event-driven device simulator software;
   interface software;
   computer processing means, including storage media and operating system software, upon which to run the circuit simulator software, the event-driven device simulator software, and the interface software;
   wherein the interface software comprises, a parameter passing portion for receiving values from and returning values to the circuit simulator software through the user-defined device modeling feature, a timing portion for instructing the event-driven simulator software to run a simulation of the device based on the values for a given period of time, a response reading portion for reading the values of the pins at the end of the period of time, the values to be returned to the circuit simulator software through the parameter passing portion and the user-defined modeling feature; and wherein upon first call of the interface by the circuit simulator for any one circuit to be simulated, the interface acquires the definition of the pins of the device from the event-driven simulator for the circuit simulator.

* * * * *